United States Patent
Weis

(10) Patent No.: US 6,496,401 B2
(45) Date of Patent: Dec. 17, 2002

(54) MEMORY CELL CONFIGURATION

(75) Inventor: Rolf Weis, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/871,011

(22) Filed: May 31, 2001

(65) Prior Publication Data

US 2002/0005535 A1 Jan. 17, 2002

(30) Foreign Application Priority Data

May 31, 2000 (DE) .......................... 100 27 912

(51) Int. Cl.[7] .......................... G11C 5/02; H01L 27/108
(52) U.S. Cl. .......................... 365/51; 365/63; 257/296; 257/301
(58) Field of Search ..................... 365/51, 63; 257/296, 257/300, 301, 302

(56) References Cited

U.S. PATENT DOCUMENTS

| | | | |
|---|---|---|---|
| 5,160,987 A | 11/1992 | Pricer et al. | 257/296 |
| 5,208,657 A | 5/1993 | Chatterjee et al. | 257/296 |
| 6,211,544 B1 * | 4/2001 | Park et al. | 257/296 |
| 6,339,239 B1 * | 1/2002 | Alsmeier et al. | 257/296 |
| 6,339,241 B1 * | 1/2002 | Mandelman et al. | 257/301 |

FOREIGN PATENT DOCUMENTS

EP 4109774 A1 10/1991

* cited by examiner

Primary Examiner—Son T. Dinh
(74) Attorney, Agent, or Firm—Laurence A. Greenberg; Werner H. Stemer; Gregory L. Mayback

(57) ABSTRACT

A memory cell configuration has memory cells, each with a trench capacitor in a trench and a vertical transistor, which is used as a selection transistor. The trench capacitors in adjacent memory cells are arranged next to a bit line and are connected to the bit line via their selection transistor. Adjacent trench capacitors connected to a bit line are arranged alternately on the two sides of the bit line.

6 Claims, 5 Drawing Sheets

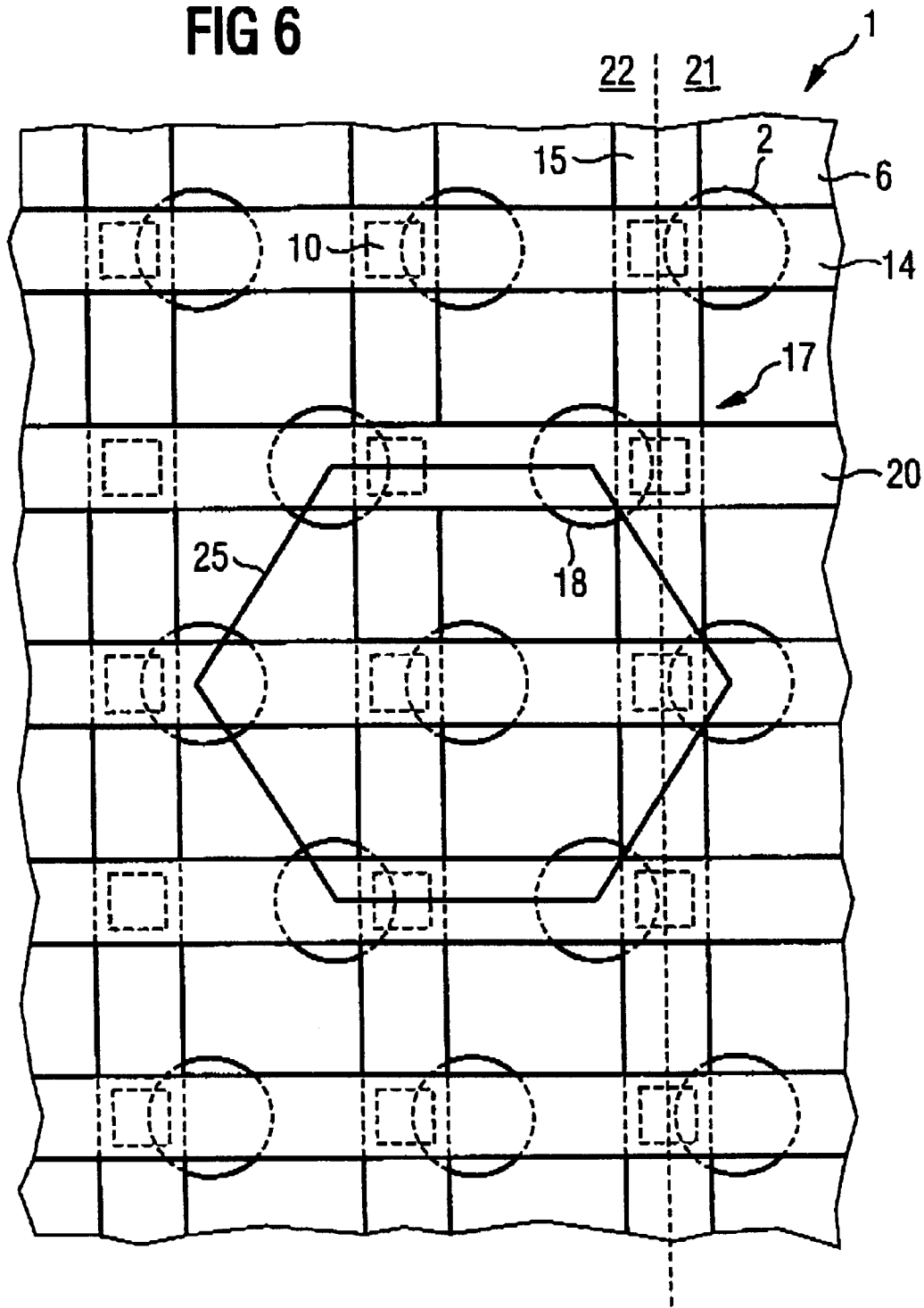

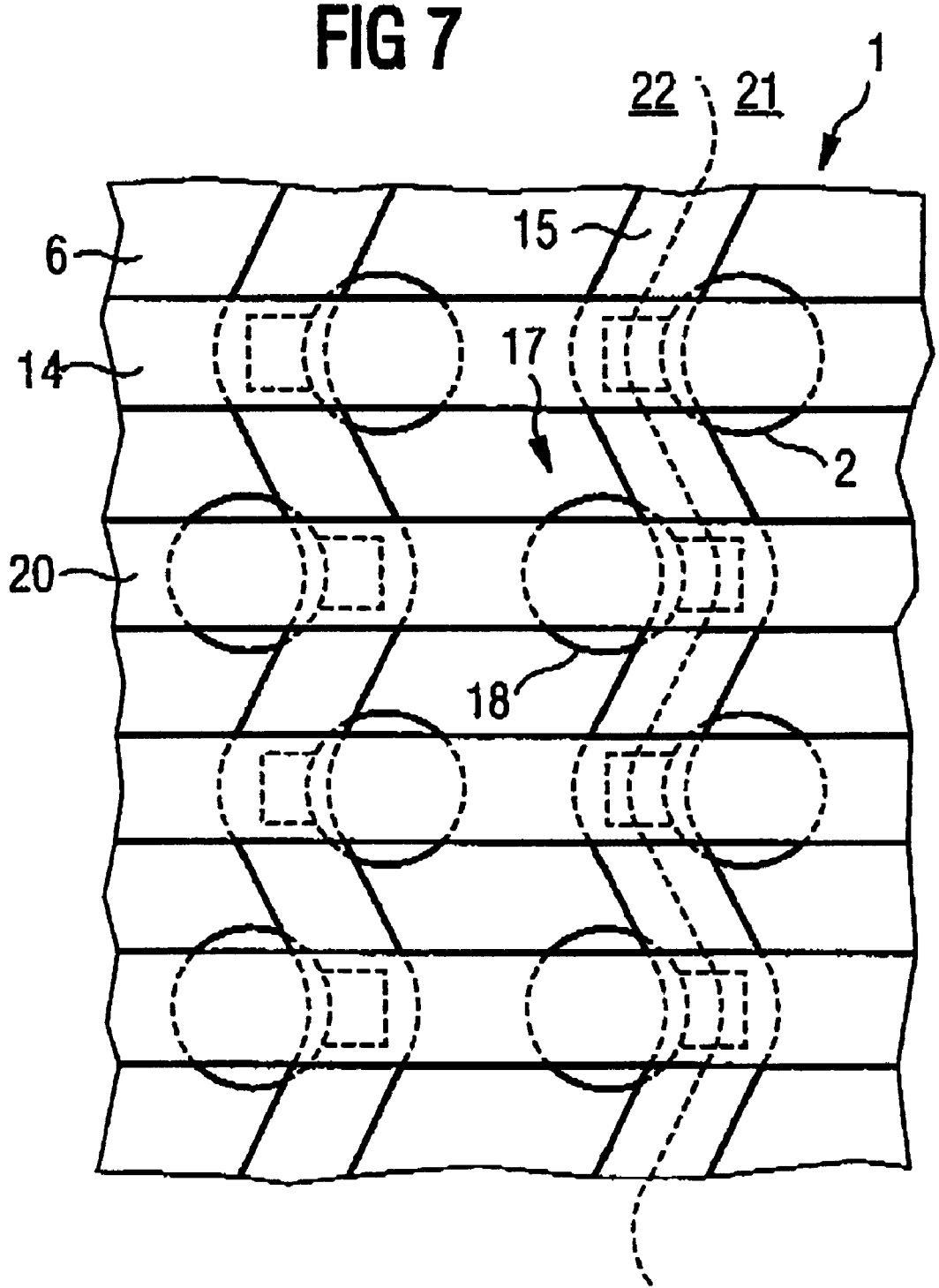

MEMORY CELL CONFIGURATION

BACKGROUND OF THE INVENTION

Field of the Invention

The present invention relates to a memory cell configuration.

Memory components, such as DRAMs (Dynamic Random Access Memories) comprise a cell array and a peripheral driver area. Individual memory cells are arranged in the cell array.

A DRAM chip contains a matrix of memory cells which are arranged in the form of rows and columns and are driven via word lines and bit lines. Data are read from the memory cells or data are written to the memory cells by virtue of suitable word lines and bit lines being activated.

Normally, a DRAM memory cell contains a transistor connected to a capacitor. The transistor comprises, among other things, two diffusion regions which are isolated from one another by a channel which is controlled by a gate. Depending on the direction of the flow of current, one diffusion region is called the drain region and the other diffusion region is called the source region.

One of the diffusion regions is connected to a bit line, the other diffusion region is connected to the capacitor, and the gate is connected to a word line. By applying suitable voltages to the gate, the transistor is controlled such that a flow of current between the diffusion regions through the channel is turned on and off.

The progressive miniaturization of memory components is increasing integration density in stages. The increase in integration density means that the surface area available per memory cell is constantly falling.

To utilize the available surface area effectively, the selection transistor may be in the form of a vertical transistor in a trench above a trench capacitor. Memory cells having a trench capacitor and a vertical transistor are described in U.S. Pat. No. 5,208,657, for example. Conventionally, the trench capacitors are arranged in a rectangular pattern in that case. A problem with this is that the alignment accuracy of successive photolithographic exposure planes can have a disadvantageous effect on the operability of the memory cells.

SUMMARY OF THE INVENTION

The object of the present invention is to provide a memory cell configuration which overcomes the above-noted deficiencies and disadvantages of the prior art devices and methods of this general kind, and which provides for improved alignment tolerance for successive photolithographic exposure planes.

With the above and other objects in view there is provided, in accordance with the invention, a memory cell configuration, comprising:

a substrate having a substrate surface;

a first memory cell with a first trench capacitor and a first transistor disposed in the substrate, the first transistor having a first gate connect;

a second memory cell with a second trench capacitor and a second transistor disposed in the substrate, the second transistor having a second gate connect;

a first word line connected to the first gate connect of the first transistor;

a second word line running adjacent to the first word line and connected to the second gate connect of the second transistor;

a bit line crossing the first word line and the second word line and dividing the substrate surface into a first area and a second area;

wherein the first memory cell and the second memory cell are connected to the bit line, and a larger part of the first trench capacitor is disposed in the first area and a larger part of the second trench capacitor is disposed in the second area.

A primary advantage of the novel configuration is the alternate arrangement of the trench capacitors with respect to the bit line. Normally, directly adjacent trench capacitors connected to a bit line have been arranged in a row below or on one side of the bit line. This meant that the minimum distance between two adjacent trench capacitors was relatively short. With the inventive arrangement, the distance between adjacent trench capacitors is significantly increased, so that the trench capacitors in the inventive arrangement can firstly be designed to have a larger diameter, which means that their capacitance is increased, and secondly have a much improved alignment tolerance with respect to the word lines and the bit lines.

In accordance with an added feature of the invention, the bit line encloses an angle with the first word line of between 45° and 90°, i.e., the bit line crosses the first word line at an angle of 45–90°. This arrangement permits a compact layout for the cell array with optimum utilization of space on the substrate surface.

In accordance with an additional feature of the invention, the bit line changes a direction of its course upon crossing a respective word line. This permits the distance between bit line and trench capacitor to be set such that the bit line contact can be designed to have a high degree of alignment tolerance.

In accordance with another feature of the invention, the first trench capacitor has six nearest adjacent trench capacitors, spaced respective distances from the first trench capacitor differing by at most 15%. In other words, the first trench capacitor has six adjacent trench capacitors whose distances from the first trench capacitor differ by at most 15%. This arrangement sets the distance between the adjacent trench capacitors such that the substrate surface has the greatest possible density of trench capacitors which are each at the greatest possible distance from their nearest adjacent trench capacitors and therefore influence one another as little as possible.

In accordance with a further feature of the invention, the first trench capacitor and further trench capacitors are arranged in corners of a hexagon. It is advantageous if, in addition to the first trench capacitor, further trench capacitors are arranged in the corners of a hexagon. The hexagonal arrangement is the densest packing in the plane, so that this arrangement permits efficient utilization of the substrate surface.

In accordance with a concomitant feature of the invention, the first trench capacitor is disposed in a bottom area of a trench formed in the substrate, and the first transistor is a vertical transistor formed above the trench capacitor in the trench. This permits very great use to be made of the available substrate surface by the trench capacitors, and the selection transistors are arranged in a space-saving manner in the upper area of the trench.

Other features which are considered as characteristic for the invention are set forth in the appended claims.

Although the invention is illustrated and described herein as embodied in a memory cell configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 is a plan view onto the novel arrangement of trench capacitors, bit lines, and word lines; and FIG. 7 is a further partial plan view onto a novel arrangement of trench capacitors, bit lines, and word lines.

Identical and functionally equivalent elements are designated with the same reference symbols throughout the figures.

DESCRIPTION OF THE PREFERRED EMBODIMENTS

Figure 1:
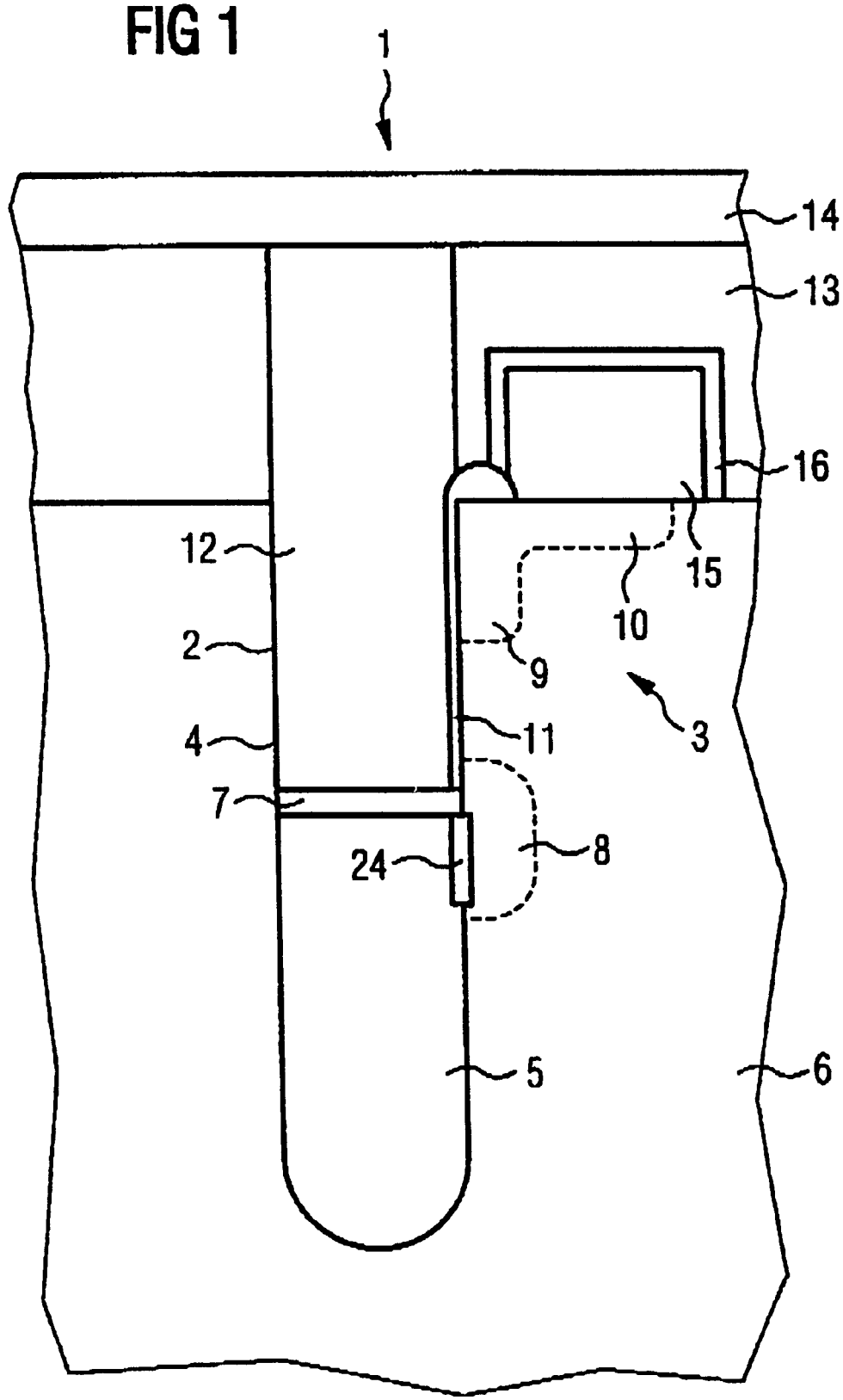
FIG. 1 is a partial section through a memory cell having a trench capacitor and a vertical selection transistor.

Referring now to the figures of the drawing in detail and first, particularly, to FIG. 1 thereof, there is seen a memory cell 1. The memory cell 1 comprises a first trench capacitor 2 and a first transistor 3, which is in the form of a vertical transistor in the exemplary embodiment. The transistor 3 may, by way of example, be in the form of a stepped transistor or else in the form of a round transistor around a trench. The first trench capacitor 2 is arranged in a trench 4 which, for its part, is arranged in a substrate 6. The bottom area of the trench 4 is filled with a bottom trench filling 5. An insulation layer 7 is disposed on the bottom trench filling 5. At the upper edge of the bottom trench filling 5, a lower diffusion region 8 is arranged at the side next to the trench 4 in the substrate 6. This diffusion region is one of the source/drain regions of the vertical transistor and is connected to the interior of the capacitor by means of an electrical connection 24. In the upper area of the trench 4, a gate oxide 11 is arranged on the side wall of the trench 4. In its upper area, the trench 4 is filled with a first gate connect 12. Arranged next to the upper area of the trench 4 is an upper doping region 9, which likewise forms a source/drain region of the vertical transistor. The upper doping region 9 is connected to a bit line doping region 10 arranged at the surface of the substrate 6. A bit line 15 is arranged on the surface of the substrate 6, above the bit line doping region 10. The bit line 15 is surrounded by a bit line casing 16, which is insulating in this case. Arranged above the substrate 6 is an intermediate oxide 13 which is made of an insulating material. Arranged on the intermediate oxide 13 is a first word line 14, which is connected to the first gate connect 12.

The substrate 6 is made of doped silicon, for example. The bottom trench filling 5 in the trench 4 is formed from a highly doped polysilicon, for example, with an insulation layer being arranged as capacitor dielectric between the bottom trench filling 5 and the substrate 6. The insulation layer 7 arranged on the bottom trench filling 5 is made of silicon oxide, for example. The lower doping region 8 and the upper doping region 9 constitute areas in the substrate 6 which have a high dopant concentration complementary to the substrate. By way of example, the gate oxide 11 is formed from silicon oxide, and the first gate connection 12 is formed from a highly doped polysilicon. In this exemplary embodiment, the intermediate oxide 13 is made of a highly doped silicate glass, such as BPSG (borophosphorus silicate glass). By way of example, the bit line 15 is formed from a highly doped polysilicon, and the first word line 14 is formed from a metal, e.g. tungsten. The bit line casing 16 can be produced from a silicon nitride.

Figure 2:
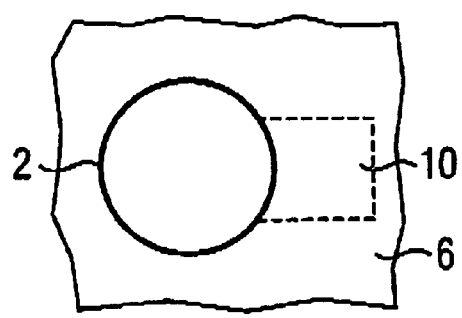
FIG. 2 is a plan view of a trench capacitor.

FIG. 2 shows the plan view of a first memory cell 1, with the first trench capacitor 2 and the bit line doping region 10 being shown in the substrate 6.

Figure 3:
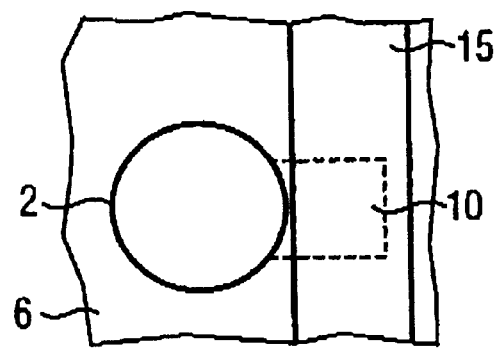
FIG. 3 is a plan view of a trench capacitor with a bit line.

With reference to FIG. 3, a plan view of the memory cell shown in FIG. 2 is shown, with FIG. 3 additionally showing the bit line 15 which runs above the bit line doping region 10.

Figure 4:
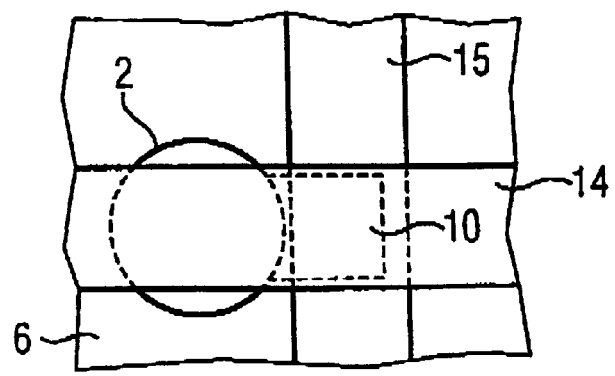
FIG. 4 is a trench capacitor with a bit line and a word line.

With reference to FIG. 4, the memory cell indicated in FIG. 3 is shown, with the first word line 14 above the bit line 15 and above the trench capacitor 2 being additionally shown.

Figure 5:
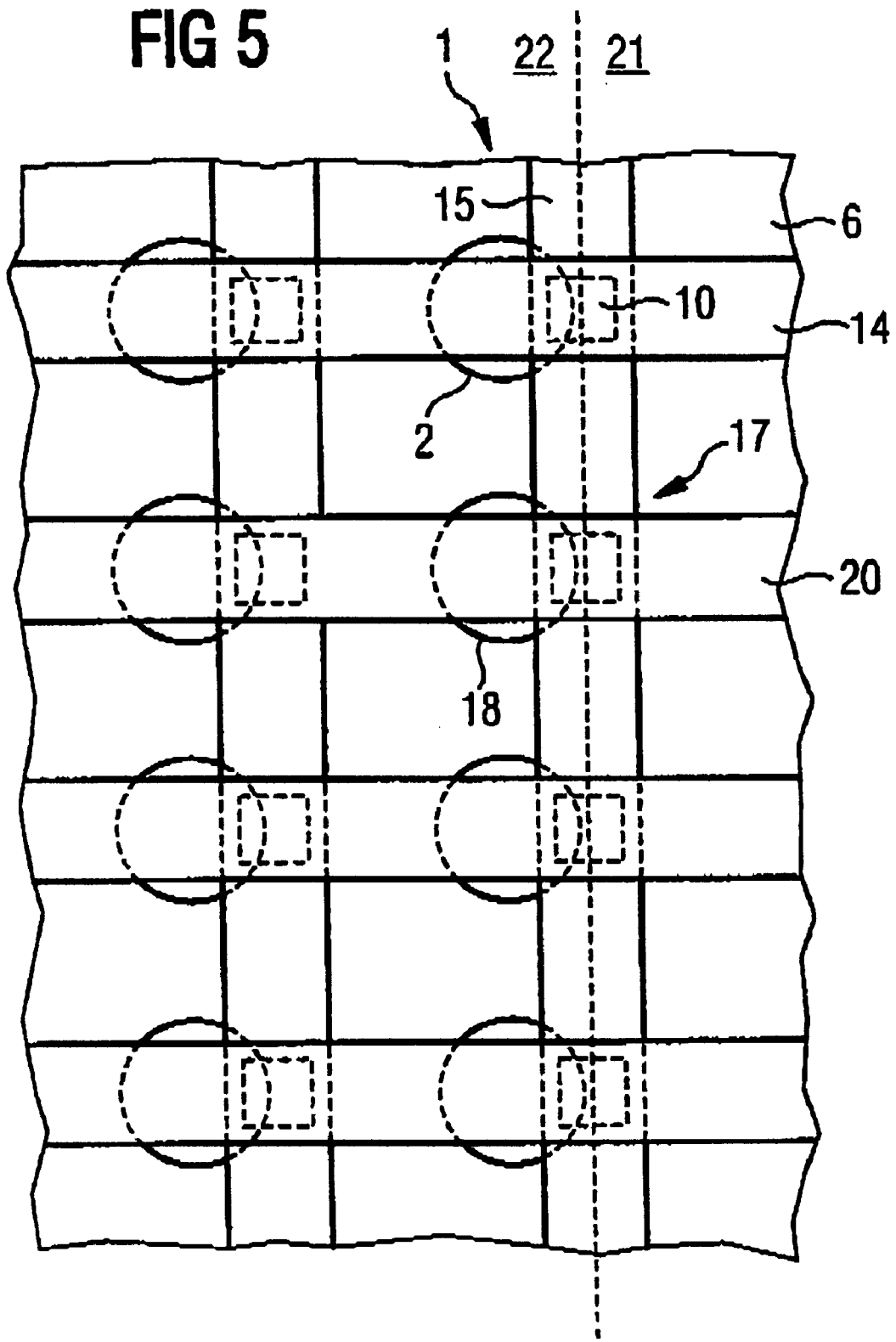
FIG. 5 is a plan view of an arrangement of trench capacitors, bit lines, and word lines.

FIG. 5 shows a first memory cell 1 and a second memory cell 17. In this case, the first memory cell 1 has a first trench capacitor 2, and the second memory cell 17 has a second trench capacitor 18. The first memory cell 1 and the second memory cell 17 are connected to a bit line 15 which runs above the bit line doping region 10. In addition, the bit line 15 divides the substrate 6 into a first area 21 and a second area 22. In FIG. 5, both the first trench capacitor 2 and the second trench capacitor 18 are arranged in the second area 22. In addition, the first memory cell 1 is connected to the first word line 14, and the second memory cell 17 is connected to the second word line 20.

With reference to FIG. 6, the plan view of a configuration according to the invention is shown. Arranged in the substrate 6 are a first memory cell 1 and a second memory cell 17. The first memory cell has a first trench capacitor 2, and the second memory cell has a second trench capacitor 18. Both the first memory cell 1 and the second memory cell 17 are connected to a bit line 15. The bit line 15 divides the substrate 6 into a first area 21 and a second area 22. In FIG. 6, the first trench capacitor 2 is arranged in the area 21, and the second trench capacitor 18 is arranged in the second area 22. The first memory cell 1 is connected to a first word line 14, and the second memory cell 17 is connected to a second word line 20, which runs adjacent to the first word line 14. Shown around one memory cell are six adjacent memory cells whose trench capacitors are arranged in the corners of a hexagon 25. The arrangement in the corners of the hexagon 25 is particularly beneficial, since this is the densest sphere packing in the plane, which means that the substrate surface is optimally utilized.

With reference to FIG. 7, another exemplary embodiment of the configuration according to the invention is shown. The difference over FIG. 6 is that the bit line is bent at an obtuse angle when crossing the first word line 14. In addition, the bit line 15 is bent at an obtuse angle when crossing each further word line.

I claim:

1. A memory cell configuration, comprising:
   a substrate having a substrate surface;
   a first memory cell with a first trench capacitor and a first transistor disposed in said substrate, said first transistor having a first gate connect;
   a second memory cell with a second trench capacitor and a second transistor disposed in said substrate, said second transistor having a second gate connect;

a first word line connected to said first gate connect of said first transistor;

a second word line running adjacent to said first word line and connected to said second gate connect of said second transistor;

a bit line crossing said first word line and said second word line and dividing said substrate surface into a first area and a second area;

wherein said first memory cell and said second memory cell are connected to said bit line, and a larger part of said first trench capacitor is disposed in said first area and a larger part of said second trench capacitor is disposed in said second area.

2. The memory cell configuration according to claim 1, wherein said bit line encloses an angle with said first word line of between 45° and 90°.

3. The memory cell configuration according to claim 1, wherein said bit line changes a direction of its course upon crossing a respective said word line.

4. The memory cell configuration according to claim 1, wherein said first trench capacitor has six nearest adjacent trench capacitors, spaced respective distances from said first trench capacitor differing by at most 15%.

5. The memory cell configuration according to claim 1, wherein said first trench capacitor and further trench capacitors are arranged in corners of a hexagon.

6. The memory cell configuration according to claim 1, wherein said first trench capacitor is disposed in a bottom area of a trench formed in said substrate, and said first transistor is a vertical transistor formed above said trench capacitor in said trench.

* * * * *